(12) United States Patent
Simsek-Ege et al.

(10) Patent No.: US 10,707,215 B2
(45) Date of Patent: Jul. 7, 2020

(54) METHODS OF FORMING SEMICONDUCTOR DEVICES, AND RELATED SEMICONDUCTOR DEVICES, MEMORY DEVICES, AND ELECTRONIC SYSTEMS

(71) Applicant: Micron Technology, Inc., Boise, ID (US)

(72) Inventors: Arzum F. Simsek-Ege, Boise, ID (US); Guangjun Yang, Meridian, ID (US); Kuo-Chen Wang, Hiroshima (JP); Mohd Kamran Akhtar, Boise, ID (US); Katsumi Koge, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/109,215

(22) Filed: Aug. 22, 2018

(65) Prior Publication Data

US 2020/0066729 A1    Feb. 27, 2020

(51) Int. Cl.
| | |
|---|---|
| *G11C 11/24* | (2006.01) |
| *H01L 27/108* | (2006.01) |
| *H01L 21/764* | (2006.01) |
| *G11C 11/408* | (2006.01) |
| *G11C 11/4091* | (2006.01) |

(52) U.S. Cl.
CPC .... *H01L 27/10855* (2013.01); *G11C 11/4087* (2013.01); *H01L 21/764* (2013.01); *H01L 27/10814* (2013.01); *H01L 27/10873* (2013.01); *G11C 11/4091* (2013.01)

(58) Field of Classification Search
CPC ......... H01L 27/10855; H01L 27/10814; H01L 21/764

USPC .......................................................... 365/149
See application file for complete search history.

(56) References Cited

U.S. PATENT DOCUMENTS

| | | | |
|---|---|---|---|
| 7,613,024 | B2 | 11/2009 | Manning et al. |
| 9,761,312 | B1 | 9/2017 | Kajigaya |
| 2003/0178688 | A1 | 9/2003 | Yang et al. |
| 2006/0205141 | A1 | 9/2006 | Park et al. |

(Continued)

OTHER PUBLICATIONS

International Search Report from International Application No. PCT/US2019/032652, dated Sep. 6, 2019, 3 pages.

(Continued)

*Primary Examiner* — Vu A Le
(74) *Attorney, Agent, or Firm* — TraskBritt

(57) ABSTRACT

A semiconductor device comprises semiconductive pillars; digit lines laterally between the semiconductive pillars; nitride caps vertically overlying the digit lines; nitride structures overlying surfaces of the nitride caps; redistribution material structures comprising upper portions overlying upper surfaces of the nitride caps and the nitride structures, and lower portions overlying upper surfaces of the semiconductive pillars; a low-K dielectric material laterally between the digit lines and the semiconductive pillars; air gaps laterally between the low-K dielectric material and the semiconductive pillars, and having upper boundaries below the upper surfaces of the nitride caps; and a nitride dielectric material laterally between the air gaps and the semiconductive pillars. Memory devices, electronic systems, and method of forming a semiconductor device are also described.

12 Claims, 13 Drawing Sheets

(56) References Cited

U.S. PATENT DOCUMENTS

2011/0140195 A1\* 6/2011 Zahurak ................ H01L 27/105
  257/329
2015/0044868 A1 2/2015 Lee
2016/0300842 A1\* 10/2016 Tang ................... H01L 27/1085
2016/0329337 A1 11/2016 Hwang et al.
2018/0019245 A1 1/2018 Yang et al.

OTHER PUBLICATIONS

International Written Opinion from International Application No. PCT/US2019/032652, dated Sep. 6, 2019, 5 pages.

\* cited by examiner

METHODS OF FORMING SEMICONDUCTOR DEVICES, AND RELATED SEMICONDUCTOR DEVICES, MEMORY DEVICES, AND ELECTRONIC SYSTEMS

TECHNICAL FIELD

Embodiments of the disclosure relate to the field of semiconductor device design and fabrication. More specifically, embodiments of the disclosure relate to methods of forming semiconductor device structures including air gaps, and to related semiconductor devices, memory devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, DRAM device manufacturers face a tremendous challenge on reducing the DRAM cell area as feature spacing decreases to accommodate increased feature density. Reducing spacing between closely arranged digit lines can lead to undesirable electrical coupling (e.g., capacitive coupling) effects that can result in significant sense margin loss for high-speed DRAM applications. One approach to reducing such undesirable electrical coupling effects has been to form air gaps (e.g., voids spaced) adjacent the digit lines of the array. However, conventional processes of forming such air gaps can undesirably attack (e.g., etch) the conductive material (e.g., metal) of other features (e.g., redistribution layer (RDL) structures) of the array located proximate the air gaps. Such attack can effectuate reduced feature and device reliability, often resulting in the deposition of the conductive material within the air gaps that can effectuate electrical shorts during use and operation of the DRAM device.

A need, therefore, exists for new, simple, and cost-efficient methods of forming semiconductive device structures for a semiconductor device (e.g., a DRAM device), such as, for example, DRAM device structures including air gaps adjacent digit lines thereof.

DETAILED DESCRIPTION

Figure 1:
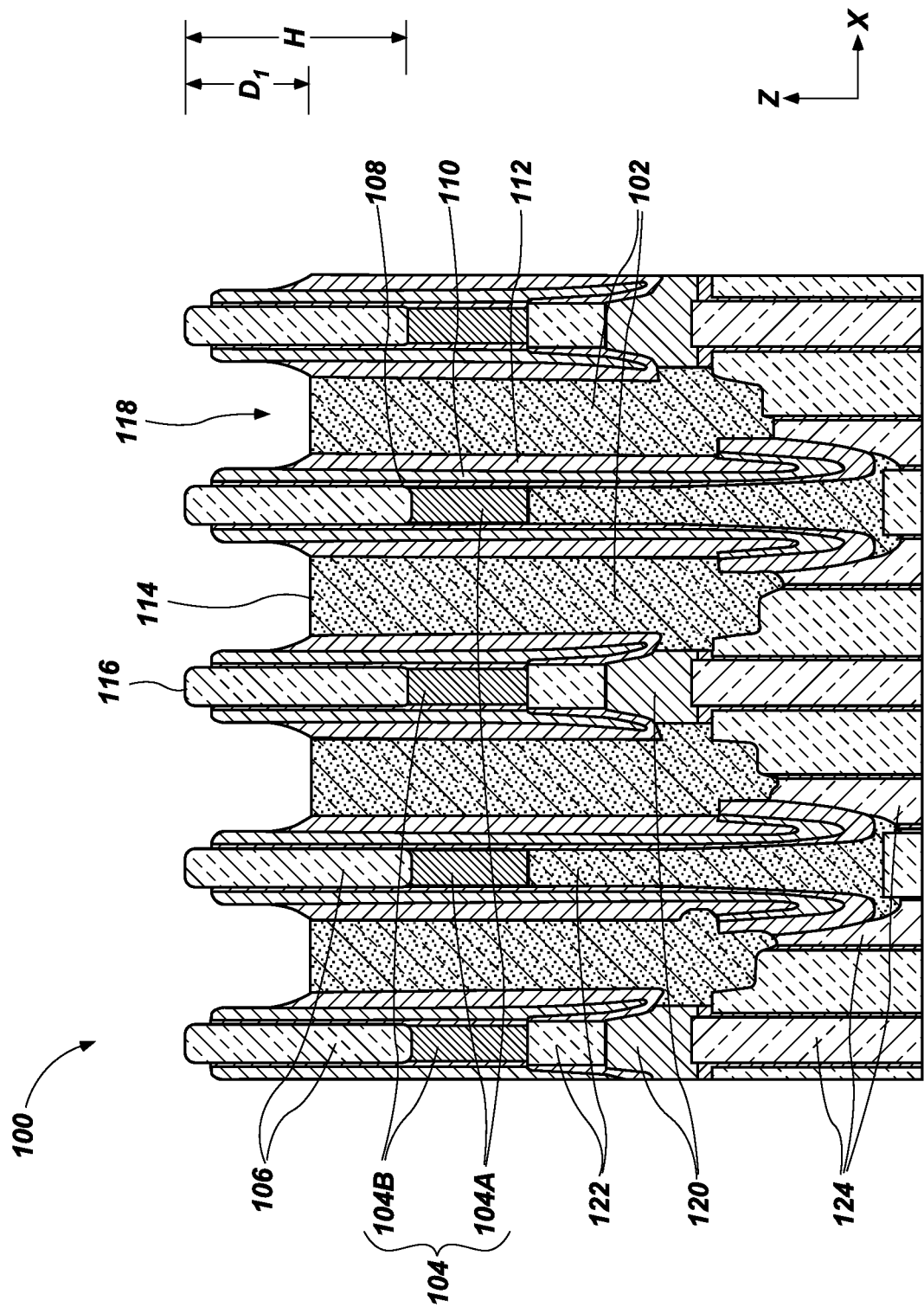
FIGS. 1 through 11 are simplified, partial cross-sectional views illustrating a method of forming a semiconductor device structure, in accordance with embodiments of the disclosure.

Methods of forming semiconductor devices are described herein, as are related semiconductor devices, memory devices, and electronic systems. In some embodiments, a method of forming a semiconductor device comprises forming a semiconductive device structure comprising laterally alternating semiconductive pillars and digit lines, nitride caps on or over the digit lines and having upper surfaces offset from (e.g., elevated relative to) upper surfaces of the semiconductive pillars, a low-K dielectric material laterally adjacent the digit lines, an oxide dielectric material laterally adjacent the low-K dielectric material, and a first nitride dielectric material laterally adjacent the low-K dielectric material. Portions of the oxide dielectric material may be selectively removed to recess the oxide dielectric material relative to the upper surfaces of the semiconductive pillars. A second nitride dielectric material may be formed (e.g., conformally formed) on or over exposed surfaces of the semiconductive pillars, the nitride caps, the low-K dielectric material, the oxide material, and the first nitride material. Portions of the second nitride dielectric material and the semiconductive pillars may be selectively removed (e.g., anisotropically etched) to form nitride dielectric structures and further recess the semiconductive pillars. Redistribution material (RDM) structures (also referred to as "redistribution layer (RDL) structures") may be formed on or over exposed surfaces of the semiconductive pillars, the nitride dielectric structures, and the nitride caps. Portions of the nitride structures not covered by the RDM structures may be selectively removed to partially uncover (e.g., expose) the oxide dielectric material. A third nitride dielectric material may be formed on or over exposed surfaces of the RDM structures, the nitride dielectric structures, and the oxide dielectric material. Portions of the third nitride dielectric material overlying the oxide dielectric material may be selectively removed (e.g., anisotropically etched) to again partially uncover (e.g., expose) the oxide dielectric material. Portions of the oxide dielectric material may then be selectively removed (e.g., exhumed) to form air gaps laterally between the digit lines and remainders of the semiconductive pillars. An isolation material may be formed (e.g., non-conformally formed) on or over exposed surfaces of the RDM structures and the third dielectric nitride material while substantially maintaining (e.g., not filling) the air gaps. The methods of the disclosure may facilitate increased reliability and performance in semiconductor device structures (e.g., DRAM device structures, such as DRAM cells), semiconductor devices (e.g., memory devices, such as DRAM devices), and electronic systems that rely on high feature density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, reference to a feature as being "over" an additional feature means and includes the feature being directly on top of, adjacent to (e.g., laterally adjacent to, vertically adjacent to), underneath, or in direct contact with the additional feature. It also includes the element being indirectly on top of, adjacent to (e.g., laterally adjacent to, vertically adjacent to), underneath, or near the additional feature, with other features located therebetween. In contrast, when an element is referred to as being "on" or another element, there are no intervening features therebetween.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1 through 11 are simplified partial cross-sectional views illustrating embodiments of a method of forming a semiconductor device structure (e.g., a memory device structure, such as a DRAM structure) for a semiconductor device (e.g., a memory device, such as a DRAM device). With the description provided below, it will be readily apparent to one of ordinary skill in the art that the methods described herein may be used in various devices. In other words, the methods of the disclosure may be used whenever it is desired to form a semiconductor device.

Referring to FIG. 1, a semiconductor device structure 100 may be formed to include semiconductive pillars 102, digit lines 104 (e.g., data lines, bit lines) laterally intervening between and separating the semiconductive pillars 102, nitride caps 106 vertically overlying the digit lines 104, semiconductive structures 122 vertically underlying the digit lines 104, conductive interconnect structures 124 vertically underlying the semiconductive structures 122, and laterally-extending stacks of a low-K dielectric material 108, an oxide dielectric material 110, and a nitride dielectric material 112 laterally intervening between and separating the semiconductive pillars 102 and the digit lines 104, the nitride caps 106, and the semiconductive structures 122. In addition, as shown in FIG. 1, the digit lines 104 may be formed to include active digit lines 104A and passive digit lines 104B. The active digit lines 104A are formed to be in electrical communication with the conductive interconnect structures 124 thereunder by way of the semiconductive structures 122 thereunder. The passive digit lines 104B are formed to be electrically isolated from the conductive interconnect structures 124 thereunder by way of isolation structures 120 formed to vertically intervene between the semiconductive structures 122 vertically underlying the passive digit lines 104B and the conductive interconnect structures 124 thereunder.

The semiconductive pillars 102 may each individually be formed of and include a semiconductive material including, but not limited to, one or more of a silicon material, a silicon-germanium material, a germanium material, a gallium arsenide material, a gallium nitride material, and an indium phosphide material. In some embodiments, the semiconductive pillars 102 are formed of and include at least one silicon material. As used herein, the term "silicon material" means and includes a material that includes elemental silicon or a compound of silicon. The semiconductive pillars 102 may, for example, each individually be formed of and include monocrystalline silicon, polycrystalline silicon, or combinations thereof In some embodiments, the semiconductive pillars 102 each comprise polycrystalline silicon. Following subsequent processing, the semiconductive pillars 102 may serve as memory cell (e.g., DRAM cell) contact (e.g., common referred to in the art as "cell con") structures, as described in further detail below.

The digit lines 104, including the active digit lines 104A and the passive digit lines 104B, may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the digit lines 104 may individually comprise one or more of titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide (IrO$_x$), elemental ruthenium (Ru), ruthenium oxide (RuO$_x$), and alloys thereof. As shown in FIG. 1, each of the semiconductive pillars 102 may include two (2) of the digit lines 104 flanking opposing sides thereof. For example, each semiconductive pillar 102 may include one of the active digit lines 104A laterally neighboring a first side thereof, and one of the passive digit lines 104B laterally neighboring a second side thereof opposing the first side.

The nitride caps 106 may each individually be formed of and include a dielectric nitride material, such as silicon nitride (Si$_3$N$_4$). In additional embodiments, a different dielectric material (e.g., an oxide dielectric material, an oxynitride dielectric material, a carbonitride dielectric material, a carboxynitride dielectric material) may be employed in place of or in conjunction with the dielectric nitride material. The nitride caps 106 may each be formed to have desired a desired height H (e.g., vertical dimension in the Z-direction). The height H of the nitride caps 106 may, for example, be within a range of from about 50 nanometers (nm) to about 100 nm, such as from about 60 nm to about 100 nm. In some embodiments, the height H of each of the nitride caps 106 is about 60 nm. The nitride caps 106 vertically extend beyond uppermost boundaries of the semiconductive pillars 102, such that upper surfaces 116 of the nitride caps 106 are substantially non-coplanar (e.g., uneven) with upper surfaces 114 of the semiconductive pillars 102.

With continued reference to FIG. 1, the low-K dielectric material 108 may be formed on or over side surfaces (e.g., sidewalls) of the digit lines 104, the nitride caps 106, and the semiconductive structures 122. The low-K dielectric material 108 may be formed of and include at least one dielectric material having a lower dielectric constant (K) than Si$_3$N$_4$, and having etch selectivity relative at least to the oxide dielectric material 110. As described in further detail below, portions of the oxide dielectric material 110 may be selectively removed relative to the low-K dielectric material 108. By way of non-limiting example, the low-K dielectric material 108 may comprise one or more of silicon oxycarbide (SiO$_x$C$_y$), silicon oxynitride (SiO$_x$N$_y$), hydrogenated silicon oxycarbide (SiC$_x$O$_y$H$_z$), and silicon oxycarbonitride (SiO$_x$C$_y$N$_z$). Formulae including one or more of "x", "y", and "z" above (e.g., SiO$_x$C$_y$, SiO$_x$N$_y$, SiC$_x$O$_y$H$_z$, SiO$_x$C$_y$N$_z$) represent a material that contains an average ratio of "x" atoms of one element, "y" atoms of another element, and "z" atoms of an additional element (if any) for every one atom of silicon (Si). As the formulae are representative of relative atomic ratios and not strict chemical structure, the low-K dielectric material 108 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the low-K dielectric material 108 comprises SiO$_x$C$_y$N$_z$. In addition, the low-K dielectric material 108 may be formed to any desired thickness (e.g., lateral dimension in the X-direction), such as a thickness less than or equal to about 5 nm, such as within a range of from about 1 nm to about 3 nm, or about 2 nm. The low-K dielectric material 108 may facilitate improved electrical properties (e.g., less current resistance) relative to Si$_3$N$_4$, and may also exhibit improved continuity relative to Si$_3$N$_4$ at smaller thicknesses (e.g., thickness less than about 4 nm, such as within a range of from about 1 nm to about 3 nm, or about 2 nm) to better protect the conductive material (e.g., metal) of at least the digit lines 104 during subsequent material removal (e.g., etching) processes. In additional embodiments, a different dielectric material (e.g., a nitride dielectric material, such as Si$_3$N$_4$) may be employed in place of the low-K dielectric material 108, so long as portions of the oxide dielectric material 110 may be selectively removed relative to the different dielectric material.

The oxide dielectric material 110 may be formed on or over surfaces of the low-K dielectric material 108. The oxide dielectric material 110 may be formed of and include one or more oxide dielectric materials having etch selectivity relative to the low-K dielectric material 108 and the nitride dielectric material 112. As described in further detail below, portions of the oxide dielectric material 110 may be selectively removed relative to the low-K dielectric material 108 and the nitride dielectric material 112. By way of non-limiting example, the oxide dielectric material 110 may comprise one or more of silicon dioxide (SiO$_2$), aluminum oxide (Al$_2$O$_3$), phosphosilicate glass, borosilicate glass, borophosphosilicate glass, and fluorosilicate glass. In some embodiments, the oxide dielectric material 110 comprises SiO$_2$. In additional embodiments, a different dielectric material (e.g., a nitride dielectric material, an oxynitride dielectric material, a carbonitride dielectric material, a carboxynitride dielectric material) may be employed in place of the oxide dielectric material 110, so long as the different dielectric material has etch selectivity relative to the low-K dielectric material 108 and the nitride dielectric material 112. In addition, the oxide dielectric material 110 may be formed to any desired thickness (e.g., lateral dimension in the X-direction), such as a thickness less than or equal to about 10 nm, less than or equal to about 6 nm, or less than or equal to about 4 nm.

The nitride dielectric material 112 may be formed on or over surfaces of the oxide dielectric material 110. The nitride dielectric material 112 may laterally intervene between the oxide dielectric material 110 and the semiconductive pillars 102. The nitride dielectric material 112 may be formed of and include one or more nitride dielectric materials having etch selectivity relative to the oxide dielectric material 110. As described in further detail below, portions of the oxide dielectric material 110 may be selectively removed relative to the nitride dielectric material 112. A material composition of the nitride dielectric material 112 may be substantially the same as or may be different than that of the nitride caps 106. By way of non-limiting example, the nitride dielectric material 112 may comprise $Si_3N_4$. In additional embodiments, a different dielectric material (e.g., an oxide dielectric material, an oxynitride dielectric material, a carbonitride dielectric material, a carboxynitride dielectric material) may be employed in place of the nitride dielectric material 112, so long as portions of the oxide dielectric material 110 may be selectively removed relative to the different dielectric material. In addition, the nitride dielectric material 112 may be formed to any desired thickness (e.g., lateral dimension in the X-direction), such as a thickness less than or equal to about 10 nm, less than or equal to about 6 nm, or less than or equal to about 4 nm.

As previously mentioned, the upper surfaces 114 of the semiconductive pillars 102 are recessed relative to the upper surfaces of the nitride caps 106. The upper surfaces 114 of the semiconductive pillars 102 may be vertically offset from the upper surfaces of the nitride caps 106 by a first vertical distance $D_1$ (e.g., depth) having a magnitude within a range of from about one-fourth (¼) to about one-third (⅓) the height H of the nitride caps 106. By way of non-limiting example, if the nitride caps 106 exhibit a height of about 60 nm, the first vertical distance $D_1$ between the upper surfaces 114 of the semiconductive pillars 102 and the upper surfaces of the nitride caps 106 may be within a range of from about 15 nm to about 20 nm. In turn, a vertical distance between the upper surfaces 114 of the semiconductive pillars 102 and the upper surfaces of the digit lines 104 may account for a remainder of the height H of the nitride caps 106. By way of non-limiting example, if the nitride caps 106 exhibit a height of about 60 nm, the vertical distance between the upper surfaces 114 of the semiconductive pillars 102 and the upper surfaces of the digit lines 104 may be within a range of from about 45 nm (e.g., if the vertical distance $D_1$ is about 15 nm) to about 40 nm (e.g., if the vertical distance $D_1$ is about 20 nm). The upper surfaces 114 of the semiconductive pillars 102 may, for example, be formed to be vertically offset from the upper surfaces 116 of the nitride caps 106 by selectively etching back an initial semiconductive material having one or more upper surfaces more vertically proximate the upper surfaces 116 of the nitride caps 106. As shown in FIG. 1, the upper surfaces 114 of the semiconductive pillars 102 may form floors of openings 118 (e.g., trenches, blind vias) laterally intervening (e.g., in the X-direction) between laterally-neighboring nitride caps 106. The openings 118 may, for example, be defined at least by the upper surfaces 114 of the semiconductive pillars 102 and exposed side surfaces (e.g., sidewalls) of the nitride dielectric material 112 and the oxide dielectric material 110.

Figure 2:
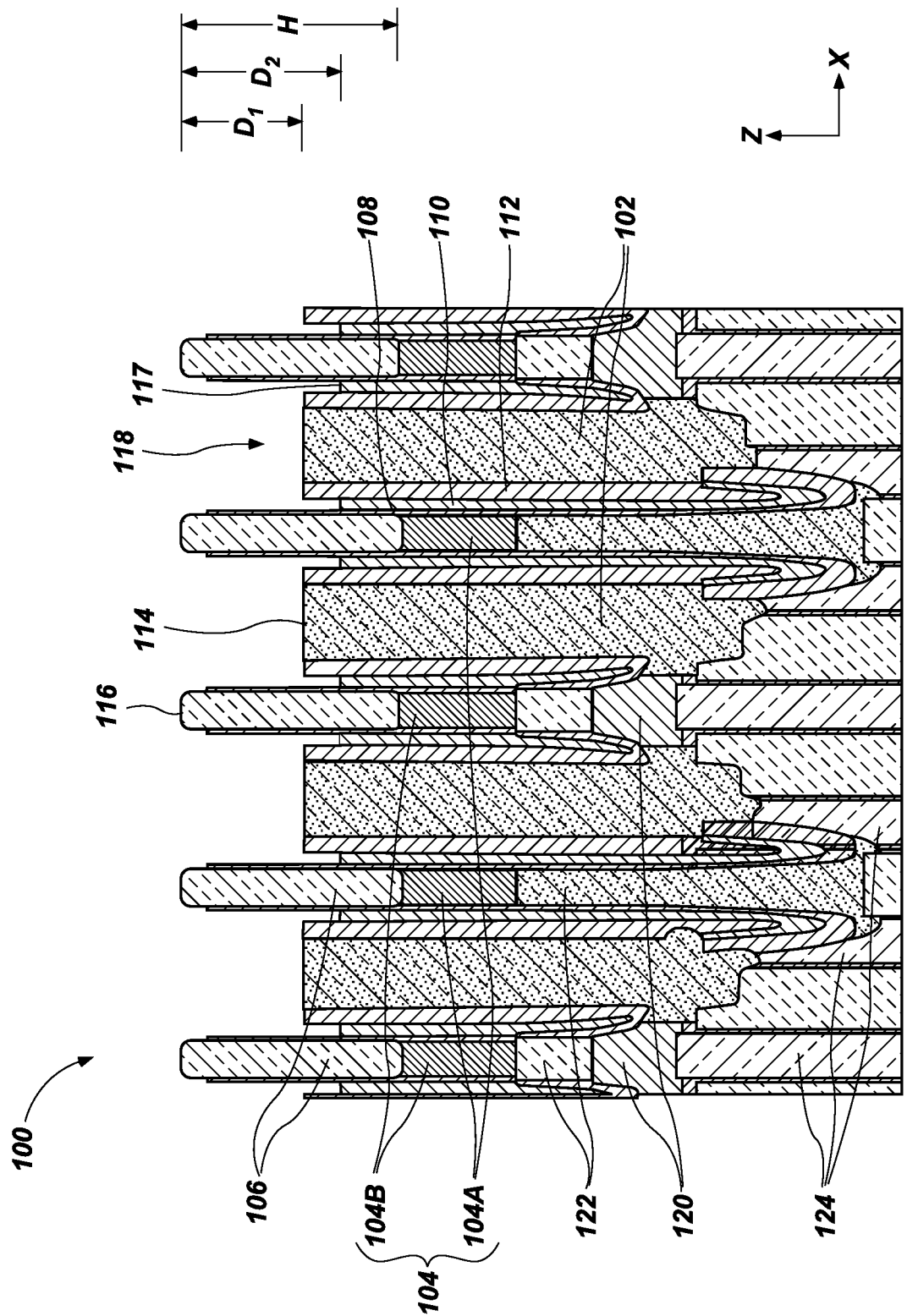

Referring next to FIG. 2, upper portions of the oxide dielectric material 110 may be selectively removed to impart the oxide dielectric material 110 with upper surfaces 117 recessed relative to the upper surfaces 114 of semiconductive pillars 102 and upper surfaces of the nitride dielectric material 112. The recessed upper surfaces 117 of the oxide dielectric material 110 may be vertically offset from the upper surfaces of the nitride caps 106 by a second vertical distance $D_2$ (e.g., depth) having a magnitude equal to the first vertical distance $D_1$ plus from about one-fourth (¼) to about one-third (⅓) the height H of the nitride caps 106. By way of non-limiting example, if the height H of the nitride caps 106 is about 60 nm and the first vertical distance $D_1$ between the upper surfaces 114 of the semiconductive pillars 102 and the upper surfaces 116 of the nitride caps 106 is about 20 nm, the second vertical distance $D_2$ between the recessed upper surfaces 117 of the oxide dielectric material 110 and the upper surfaces 116 of the nitride caps 106 may be within a range of from about 20 nm to about 40 nm. In turn, a vertical distance between the recessed upper surfaces 117 of the oxide dielectric material 110 and the upper surfaces of the digit lines 104 may account for a remainder of the height H of the nitride caps 106. By way of non-limiting example, if the height H of the nitride caps 106 is about 60 nm and the first vertical distance $D_1$ is about 20 nm, the vertical distance between the recessed upper surfaces 117 of the oxide dielectric material 110 and the upper surfaces of the digit lines 104 may be within a range of from about 15 nm (e.g., if the second vertical distance $D_2$ is about 35 nm) to about 20 nm (e.g., if the second vertical distance $D_2$ is about 40 nm).

The upper portions of the oxide dielectric material 110 may be selectively removed by treating the semiconductor device structure 100 with at least one etchant (e.g., wet etchant) formulated to selectively remove exposed portions of the oxide dielectric material 110 without substantially removing exposed portions of the semiconductive pillars 102, the nitride caps 106, the low-K dielectric material 108, and the nitride dielectric material 112. By way of non-limiting example, the etchant may comprise one or more of hydrofluoric acid (HF), a buffered oxide etchant (BOE), and nitric acid ($HNO_3$). In some embodiments, the etchant comprises a solution including water and HF at a ratio within a range of from about 500:1 to about 100:1. The semiconductor device structure 100 may be exposed to the etchant using conventional processes (e.g., a spin-coating process, a spray-coating process, an immersion-coating process, a vapor-coating process, a soaking process, combinations thereof) and conventional processing equipment, which are not described in detail herein.

Figure 3:
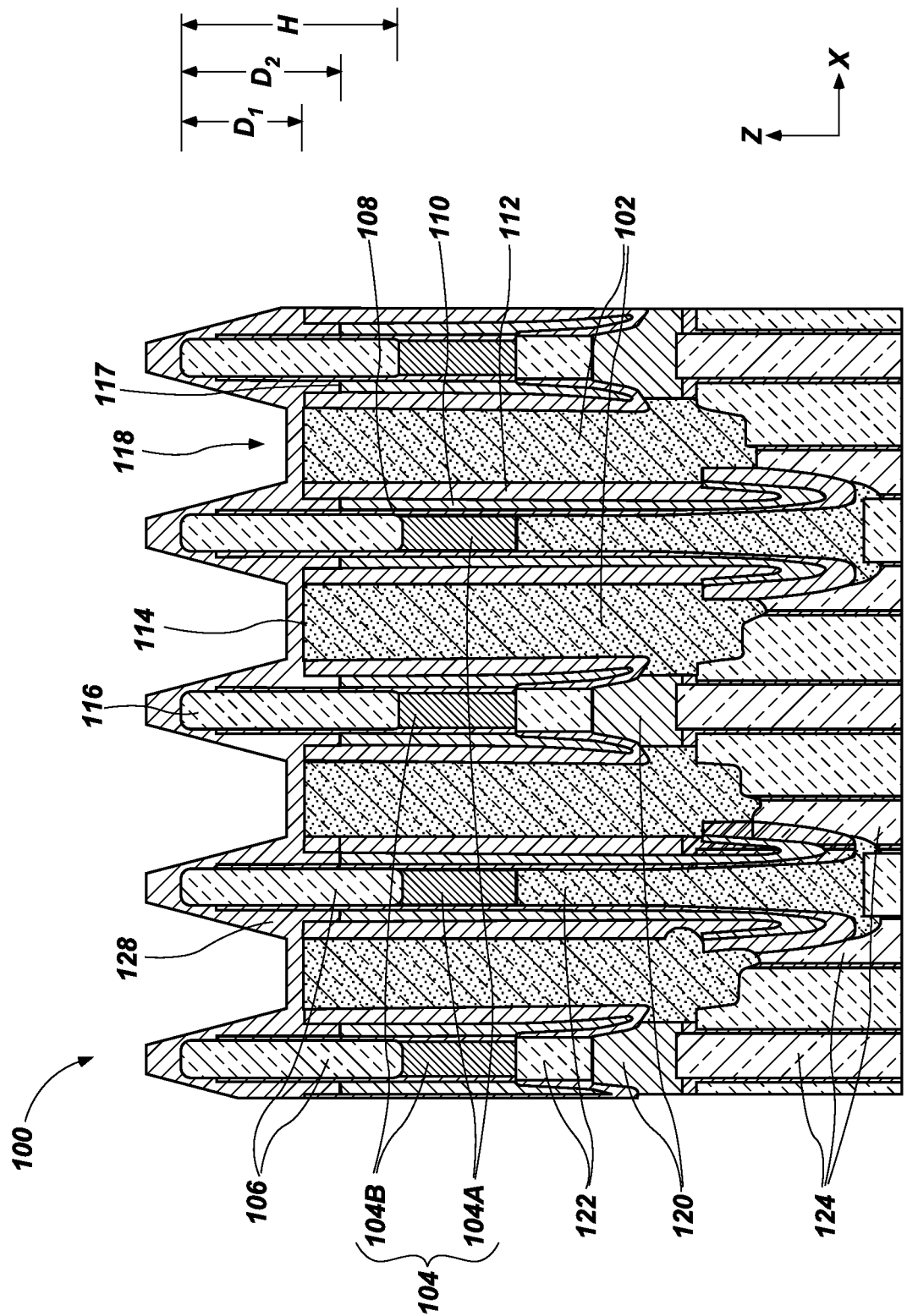

Referring next to FIG. 3, an additional (e.g., second) nitride dielectric material 128 may be formed on or over exposed (e.g., uncovered, bare) surfaces of the semiconductor device structure 100 (e.g., exposed surfaces of the semiconductive pillars 102, the nitride caps 106, the low-K dielectric material 108, the oxide dielectric material 110, and the nitride dielectric material 112). As shown in FIG. 3, the additional nitride dielectric material 128 may at least partially (e.g., substantially) conform to a topography defined by the surfaces (e.g., upper surfaces, side surfaces) upon which the additional nitride dielectric material 128 is formed. The additional nitride dielectric material 128 may be formed of and include one or more nitride dielectric materials having etch selectivity relative to the oxide dielectric material 110. A material composition of the additional nitride dielectric material 128 may be substantially the same as or may be different than that of the nitride caps 106 and/or the nitride dielectric material 112. By way of non-limiting example, the additional nitride dielectric material 128 may comprise $Si_3N_4$. In additional embodiments, a different dielectric material (e.g., an oxide dielectric material, an oxynitride dielectric material, a carbonitride dielectric material, a carboxynitride dielectric material) may be employed in place of the additional nitride dielectric material 128, so long as the different dielectric material has etch selectivity relative to the oxide dielectric material 110. In addition, the additional nitride dielectric material 128 may be formed to any desired thickness, such as a thickness within a range of from about 25 percent to about 40 percent of a diameter (e.g., width) of each of the semiconductive pillars 102. For example, if the semiconductive pillars 102 each have a width of about 10 nm, the additional nitride dielectric material 128 may have a thickness within a range of from about 2.5 nm to about 4 nm.

The additional nitride dielectric material 128 may be formed (e.g., conformally formed) using conventional processes (e.g., conventional conformal deposition processes), which are not described in detail herein. By way of non-limiting example, the additional nitride dielectric material 128 may be formed by way of a conventional ALD process.

Figure 4:
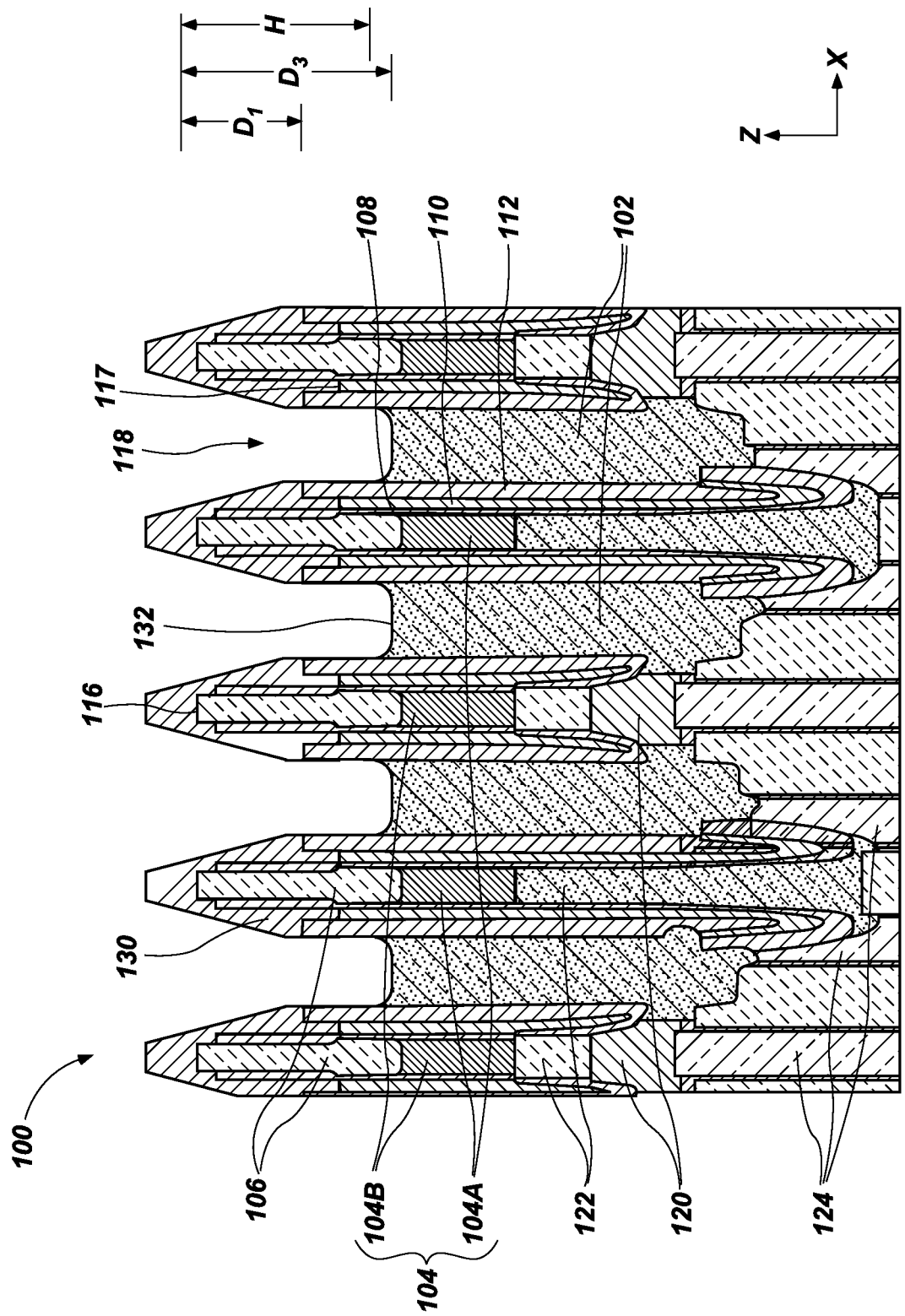

Referring next to FIG. 4, portions of the additional nitride dielectric material 128 (FIG. 3) overlying the semiconductive pillars 102 may be removed (commonly referred to in the art as "punched through"), along with upper portions of the semiconductive pillars 102, to form nitride dielectric structures 130 and to modify (e.g., reduce a height of) the semiconductive pillars 102 to exhibit recessed upper surfaces 132. The recessed upper surfaces 132 of the semiconductive pillars 102 may be vertically offset from the upper surfaces of the nitride caps 106 by a third vertical distance $D_3$ (e.g., depth) greater than the second vertical distance $D_2$ (FIG. 3). Accordingly, the removal process may increase the depth of the openings 118. The recessed upper surfaces 132 of the semiconductive pillars 102 may be vertically positioned at or between vertical boundaries (e.g., upper surfaces, lower surfaces) of the digit lines 104. As shown in FIG. 4, in some embodiments, the recessed upper surfaces 132 of the semiconductive pillars 102 are located vertically proximate (e.g., are substantially coplanar with) the upper surfaces of the digit lines 104. In additional embodiments, the recessed upper surfaces 132 of the semiconductive pillars 102 are vertically recessed relative to the upper surfaces of the digit lines 104 and vertically elevated relative to the lower surfaces of the digit lines 104.

Portions of the additional nitride dielectric material 128 (FIG. 3) and the semiconductive pillars 102 may be selectively removed using conventional processes (e.g., conventional material removal processes), which are not described in detail herein. By way of non-limiting example, the additional nitride dielectric material 128 (FIG. 3) and the semiconductive pillars 102 may be subjected to anisotropic etching (e.g., anisotropic dry etching, such as one or more of reactive ion etching (RIE), deep RIE, plasma etching, reactive ion beam etching, and chemically assisted ion beam etching) to selectively remove portions thereof and form the nitride dielectric structures 130 and the recessed upper surfaces 132 of the semiconductive pillars 102.

Figure 5:
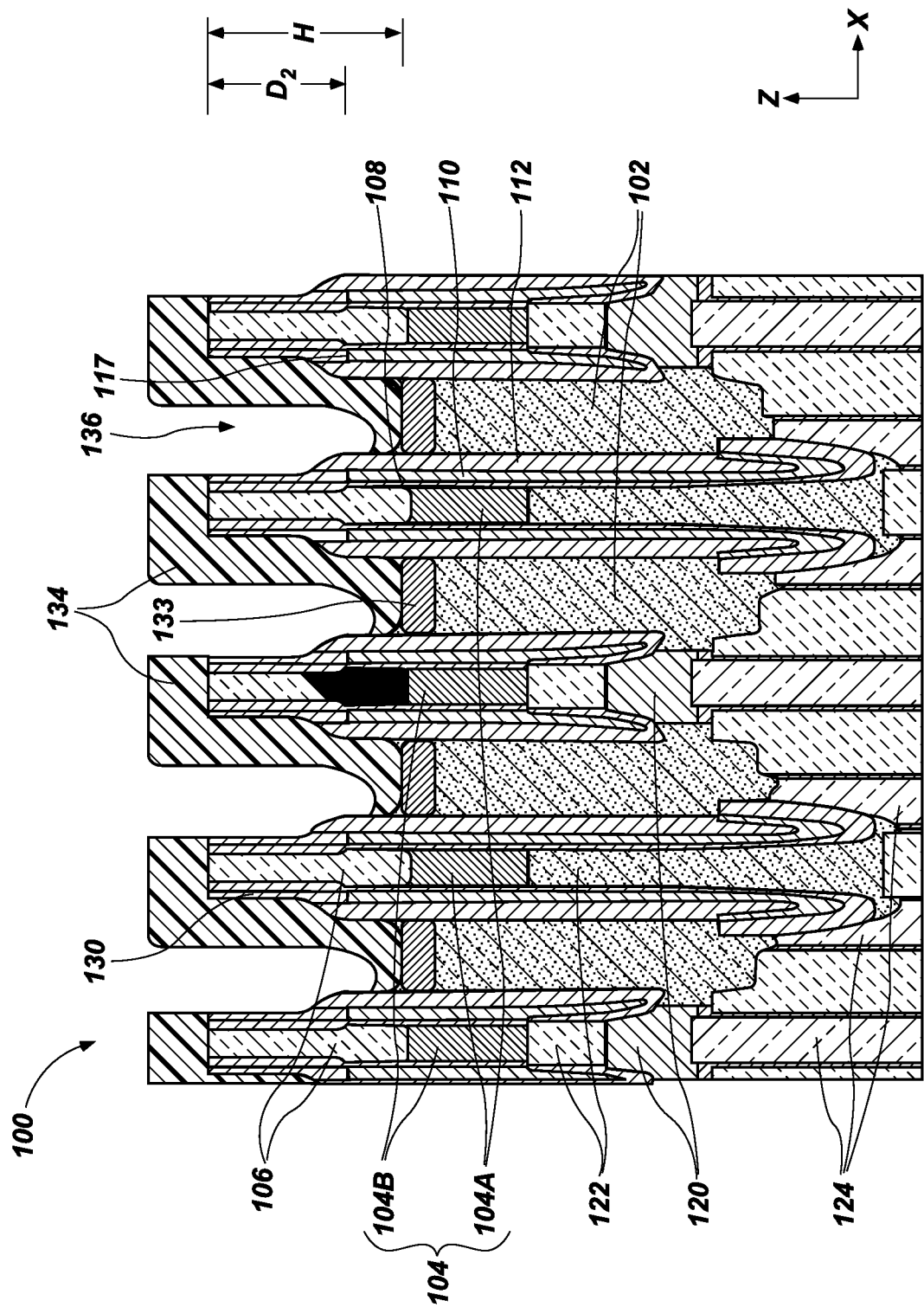

Referring next to FIG. 5, a silicide material 133 may be formed on or over the semiconductive pillars 102, and redistribution material (RDM) structures 134 (also referred to as "redistribution layer (RDL) structures") may be formed on or over the silicide material 133. The silicide material 133 may be configured and formulated to couple (e.g., physically couple, electrically couple) the semiconductive material of the semiconductive pillars 102 to the RDM structures 134. By way of non-limiting example, the silicide material 133 may comprise one or more of cobalt silicide (CoSi), tungsten silicide (WSi), tantalum silicide (TaSi), molybdenum silicide (MoSi), nickel silicide (NiSi), and titanium silicide (TiSi).

The RDM structures 134 may be configured to effectively shift (e.g., stagger, adjust, modify) lateral positions (e.g., in the X-direction) of the semiconductive pillars 102 to accommodate a desired arrangement (e.g., a hexagonal close-packed arrangement) of storage node (e.g., capacitor) structures vertically over and in electrical communication with the semiconductive pillars 102. The RDM structures 134 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 134 may individually comprise one or more of TiN, TaN, WN, TiAlN, Ti, Pt, Rh, Ir, $IrO_x$, Ru, $RuO_x$, and alloys thereof.

As shown in FIG. 5, the RDM structures 134 may partially fill the openings 118 (FIG. 4) vertically overlying the semiconductive pillars 102. Lower portions of the RDM structures 134 may be positioned within the openings 118 (FIG. 4), and on or over the silicide material 133 overlying the upper surfaces of the semiconductive pillars 102. Upper portions of the RDM structures 134 may be positioned outside of the openings 118 (FIG. 4), and on or over upper surfaces of at least the nitride caps 106, the low-K dielectric material 108, and the nitride dielectric structures 130. In addition, for each opening 118 (FIG. 4) the RDM structure 134 associated therewith may substantially cover side surfaces (e.g., sidewalls) of one of the laterally-neighboring nitride dielectric structures 130 disposed with the opening 118 (FIG. 4) without substantially covering side surfaces (e.g., sidewalls) of another of the laterally-neighboring nitride dielectric structures 130 disposed with the opening 118 (FIG. 4). Accordingly, the RDM structures 134 may partially define and be laterally separated by apertures 136 having centerlines laterally offset (e.g., in the X-direction) from centerlines of the openings 118 (FIG. 4) within which the RDM structures 134 are partially located. Each aperture 136 may, for example, individually exhibit a lower vertical boundary (e.g., floor) and a first lateral boundary defined by one (e.g., a first) of the RDM structures 134, and a second lateral boundary defined by one of the nitride dielectric structures 130 and another (e.g., a second) of the RDM structures 134 vertically overlying the one of the nitride dielectric structures 130.

The silicide material 133 and the RDM structures 134 may be formed using conventional processes (e.g., conventional material deposition processes, conventional photolithographic patterning processes, conventional material removal processes) and conventional processing equipment, which are not described in detail herein.

Figure 6:
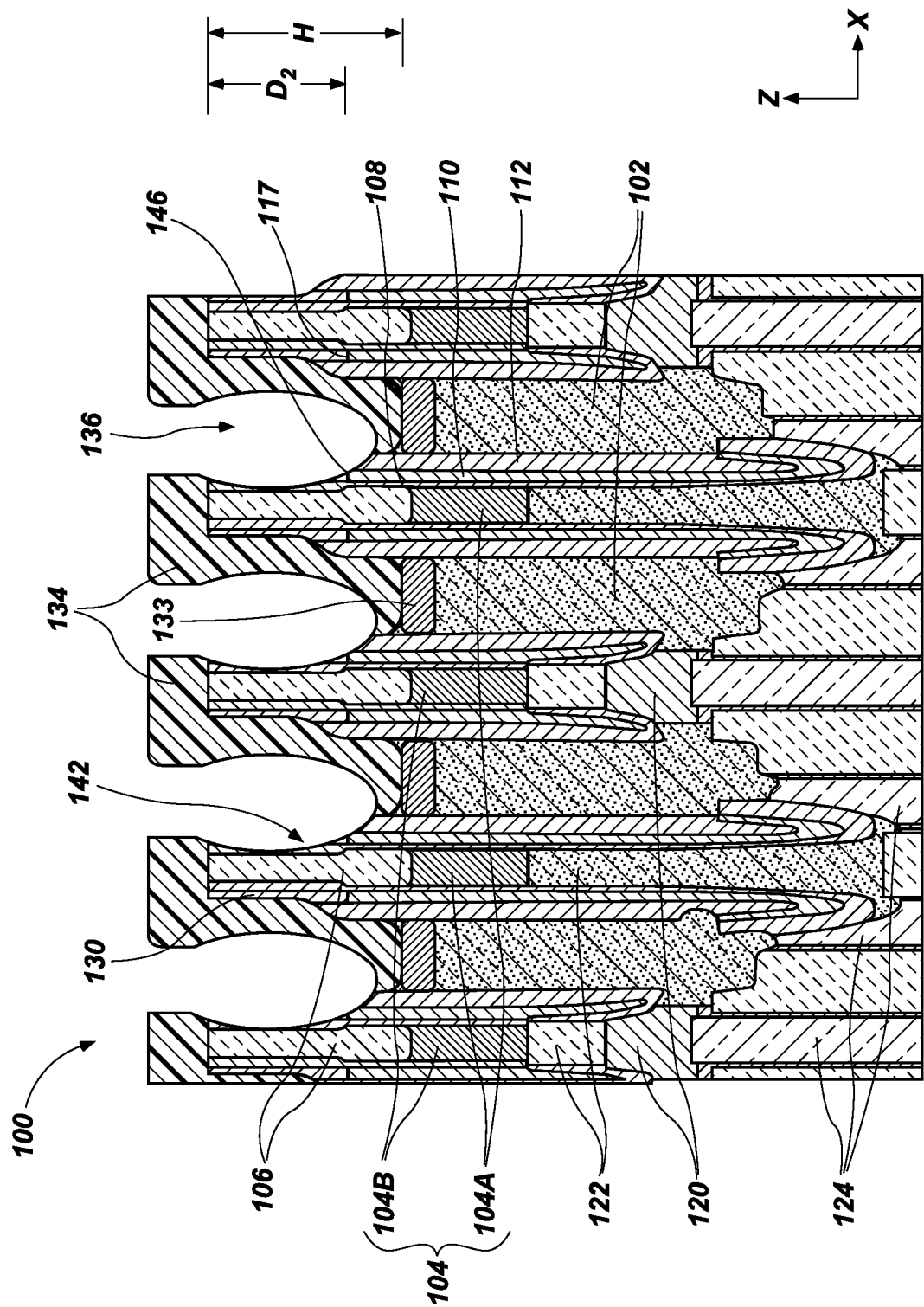

Referring next to FIG. 6, the semiconductor device structure 100 may be subjected to at least one material removal process to selectively remove portions of at least the nitride dielectric structures 130, the oxide dielectric material 110, and the nitride dielectric material 112 accessible through the apertures 136. As shown in FIG. 6, the material removal process may remove portions of the nitride dielectric structures 130, the oxide dielectric material 110, and the nitride dielectric material 112 not protected (e.g., not covered) by the RDM structures 134. The material removal process may, for example, etch back side surfaces of the nitride dielectric structures 130, the oxide dielectric material 110, and the nitride dielectric material 112 that are exposed or that become exposed within the apertures 136. Accordingly, for each aperture 136, the material removal process may laterally expand one side (e.g., a side defined by one of the nitride dielectric structures 130) of the aperture 136 to form an undercut region 142 laterally extending under an upper portion of one of the RDM structures 134, while not substantially laterally expanding another side (e.g., a side defined by another of the RDM structures 134) of the aperture 136. The material removal process may expose surfaces 146 of the oxide dielectric material 110 within the apertures 136.

The portions of the nitride dielectric structures 130, the oxide dielectric material 110, and the nitride dielectric material 112 accessible through the apertures 136 may be selectively removed by treating the semiconductor device structure 100 with at least one etchant (e.g., wet etchant) selective to the nitride dielectric structures 130, the oxide dielectric material 110, and the nitride dielectric material 112 over the RDM structures 134. By way of non-limiting example, the etchant may comprise one or more HF-based etchants. In some embodiments, the etchant comprises a solution including water and HF at a ratio within a range of from about 500:1 to about 100:1. The semiconductor device structure 100 may be exposed to the etchant using conventional processes (e.g., a spin-coating process, a spray-coating process, an immersion-coating process, a vapor-coating process, a soaking process, combinations thereof) and conventional processing equipment, which are not described in detail herein.

Figure 7:
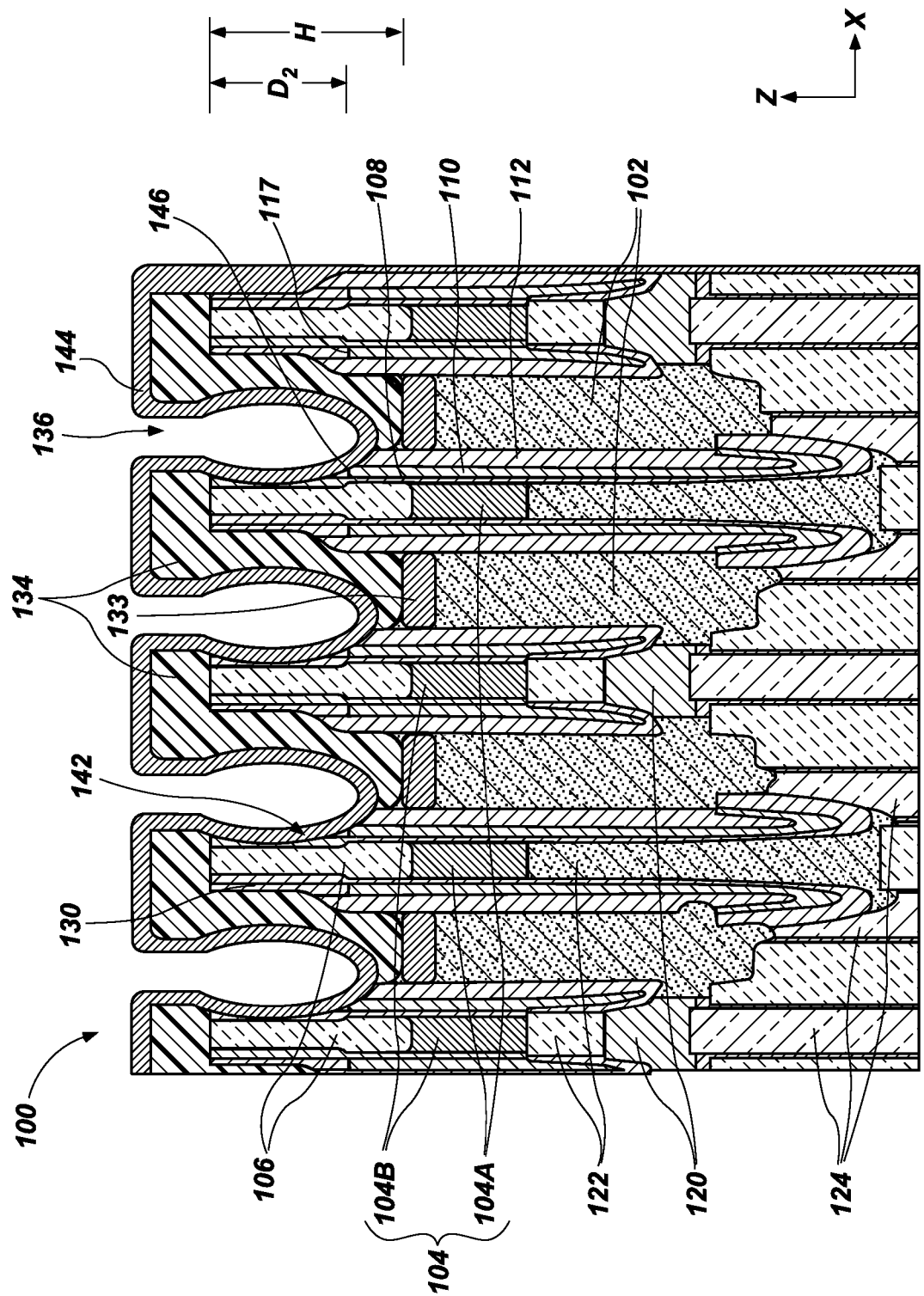

Referring next to FIG. 7, another (e.g., third) nitride dielectric material 144 may be formed on or over exposed (e.g., uncovered, bare) surfaces of the semiconductor device structure 100 (e.g., exposed surfaces of the RDM structures 134, the nitride dielectric structures 130, the low-K dielectric material 108, the oxide dielectric material 110, and the nitride dielectric material 112). As shown in FIG. 7, the another nitride dielectric material 144 may at least partially (e.g., substantially) conform to a topography defined by the surfaces (e.g., upper surfaces, side surfaces) upon which the another nitride dielectric material 144 is formed. The another nitride dielectric material 144 may be formed of and include one or more nitride dielectric materials having etch selectivity relative to the oxide dielectric material 110. A material composition of the another nitride dielectric material 144 may be substantially the same as or may be different than that of the nitride caps 106, the nitride dielectric material 112, and/or the nitride dielectric structures 130. By way of non-limiting example, the another nitride dielectric material 144 may comprise $Si_3N_4$. In additional embodiments, a different dielectric material (e.g., an oxide dielectric material, an oxynitride dielectric material, a carbonitride dielectric material, a carboxynitride dielectric material) may be employed in place of the another nitride dielectric material 144, so long as the different dielectric material has etch selectivity relative to the oxide dielectric material 110. In addition, the another nitride dielectric material 144 may be formed to any desired thickness, such as a thickness less than or equal to about 10 nm, less than or equal to about 8 nm, or within a range of from about 4 nm to about 8 nm. In some embodiments, the another nitride dielectric material 144 is formed to a thickness of about 8 nm.

The another nitride dielectric material 144 may be formed (e.g., conformally formed) using conventional processes (e.g., conventional conformal deposition processes), which are not described in detail herein. By way of non-limiting example, the another nitride dielectric material 144 may be formed by way of a conventional ALD process.

Figure 8:
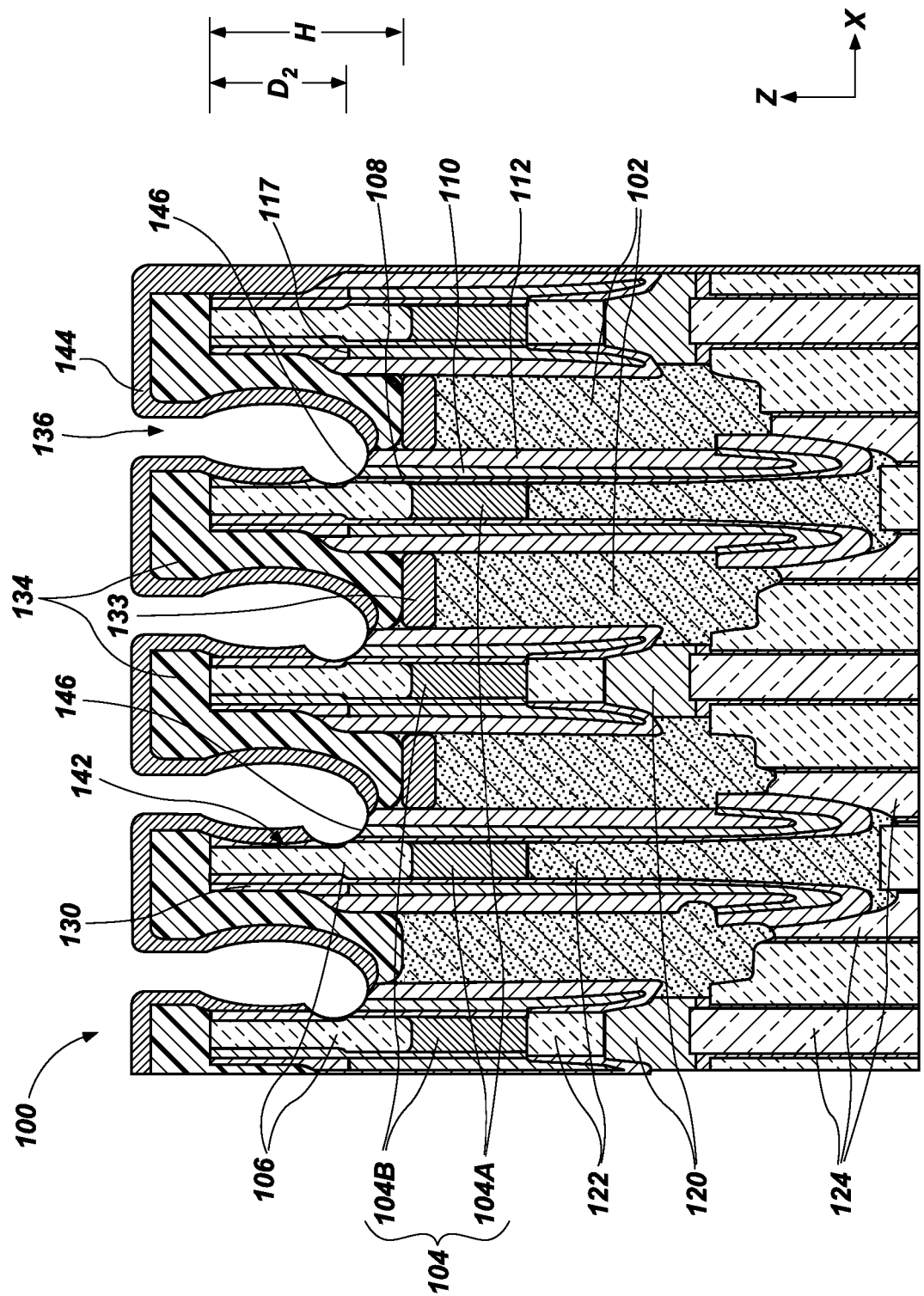

Referring next to FIG. 8, portions of the another nitride dielectric material 144 overlying the oxide dielectric material 110 within apertures 136 may be removed (e.g., "punched through") to again expose (e.g., uncover) the surfaces 146 of the oxide dielectric material 110 within the apertures 136. Other portions (e.g., portions overlying the RDM structures 134) of the another nitride dielectric material 144 within the apertures 136 may be maintained. The remaining portions of the another nitride dielectric material 144 may serve to protect the features thereunder during subsequent processing (e.g., subsequent etching processes), as described in further detail below.

The portions of the another nitride dielectric material 144 overlying the oxide dielectric material 110 within apertures 136 may be selectively removed using conventional processes, which are not described in detail herein. By way of non-limiting example, the another nitride dielectric material 144 may be subjected to anisotropic etching (e.g., anisotropic dry etching, such as one or more of RIE, deep RIE, plasma etching, reactive ion beam etching, and chemically assisted ion beam etching) to selectively remove the portions thereof overlying the oxide dielectric material 110 within apertures 136.

Figure 9:
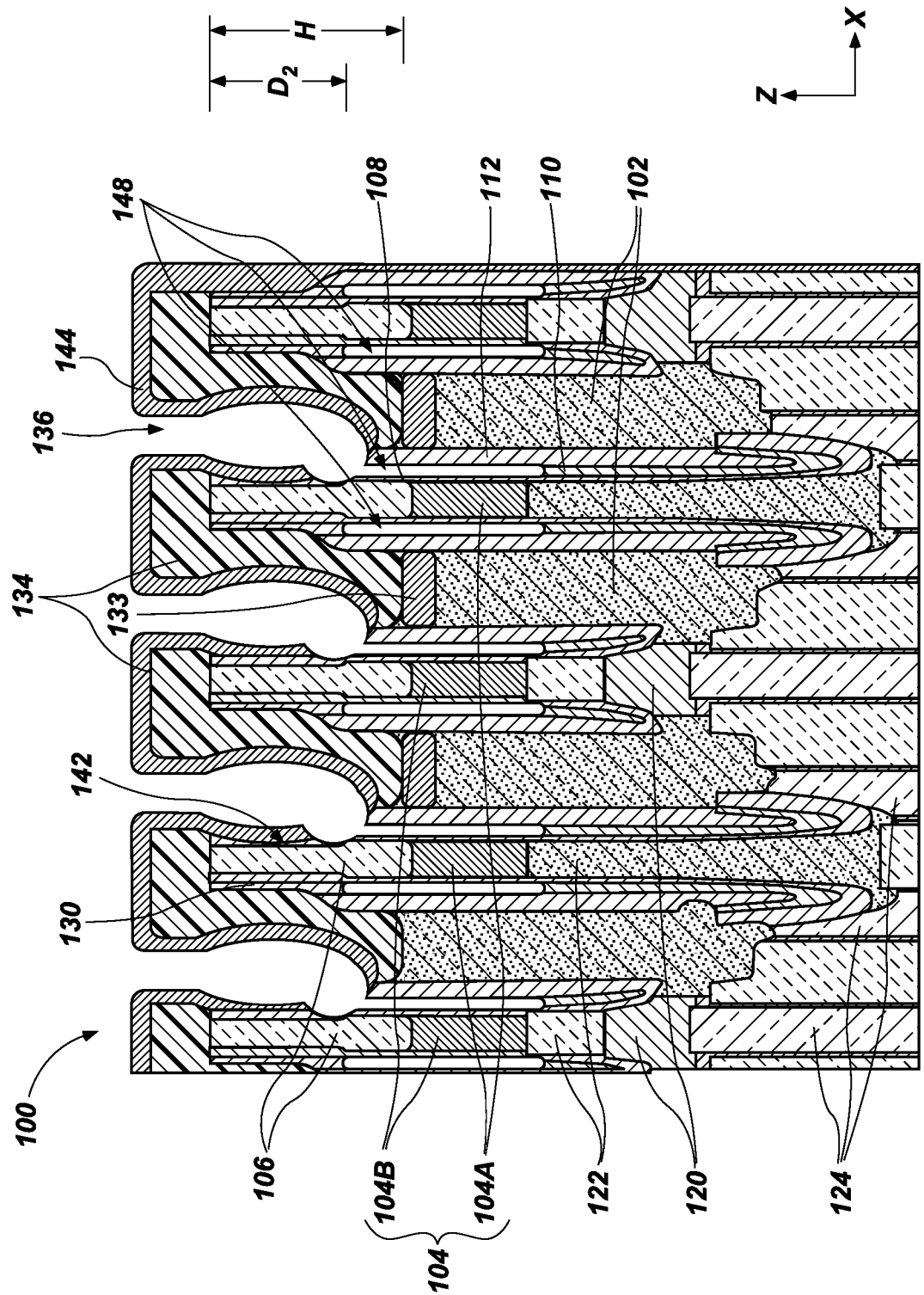

Referring next to FIG. 9, portions of the oxide dielectric material 110 accessible through the apertures 136 may be selectively removed (e.g., exhumed) to form air gaps 148 laterally adjacent the digit lines 104. The air gaps 148 may vertically extend from locations vertically above upper surfaces of the digit lines 104 (but below upper surfaces of the RDM structures 134, the nitride caps 106, and the nitride dielectric structures 130) to locations vertically below lower surfaces of the digit lines 104. As shown in FIG. 9, in some embodiments the air gaps 148 vertically terminate at locations proximate the lower surfaces of the digit lines 104. As such, at least some portions of the oxide dielectric material 110 positioned vertically below the lower surfaces of the digit lines 104 may be maintained. In additional embodiments, additional amounts (e.g., all; more, but less than the all) of the oxide dielectric material 110 may be removed, such that the air gaps 148 vertically terminate at locations more distal from the lower surfaces of the digit lines 104.

The portions of the oxide dielectric material 110 accessible through the apertures 136 may be selectively removed by treating the semiconductor device structure 100 with at least one etchant (e.g., wet etchant) formulated to selectively remove the exposed portions of the oxide dielectric material 110 without substantially removing exposed portions of the another nitride dielectric material 144, the RDM structures 134, the nitride dielectric structures 130, the nitride caps 106, the low-K dielectric material 108, and the nitride dielectric material 112. By way of non-limiting example, the etchant may comprise one or more of HF, BOE, and $HNO_3$. In some embodiments, the etchant comprises a solution including water and HF at a ratio within a range of from about 500:1 to about 100:1. The semiconductor device structure 100 may be exposed to the etchant using conventional processes (e.g., a spin-coating process, a spray-coating process, an immersion-coating process, a vapor-coating process, a soaking process, combinations thereof) and conventional processing equipment, which are not described in detail herein.

Figure 10:
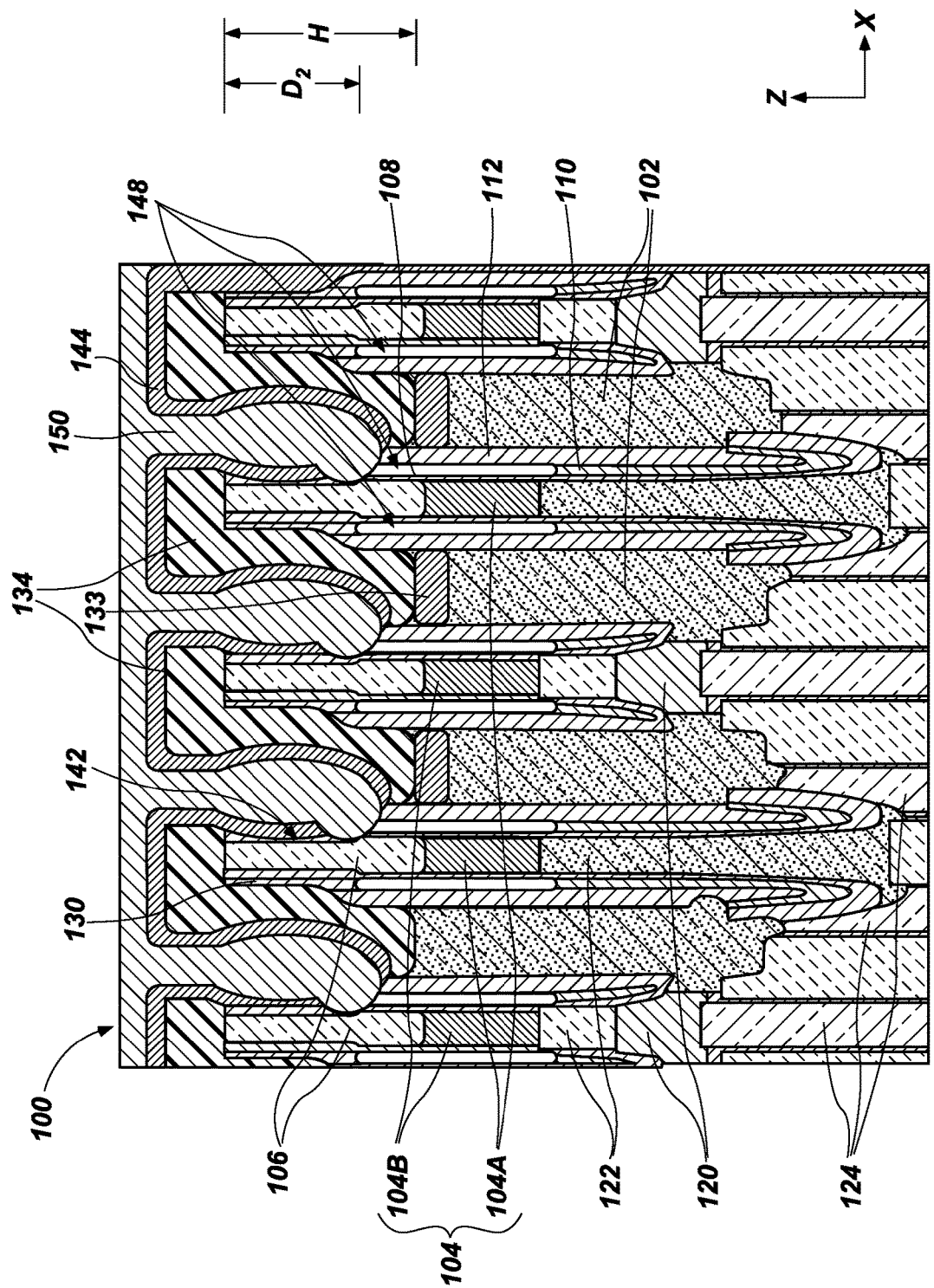
Figure 11:
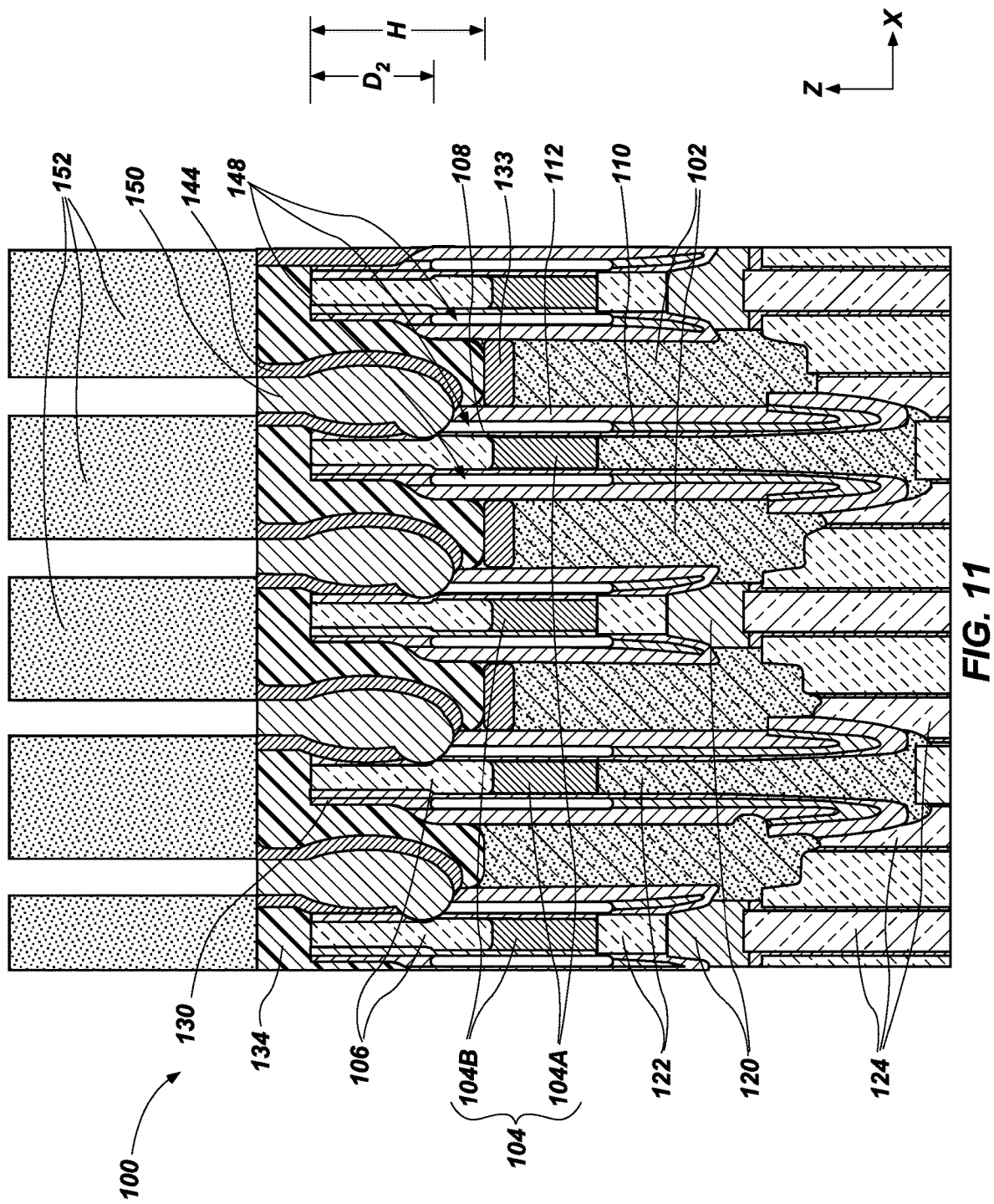

Referring next to FIG. 10, an isolation material 150 may be non-conformally formed over exposed surfaces of the semiconductor device structure 100. As shown in FIG. 10 the isolation material 150 may substantially fill remaining portions of the apertures 136 (FIG. 9) without substantially filling the air gaps 148. Accordingly, the air gaps 148 may remain laterally adjacent the digit lines 104 following the formation of the isolation material 150. The isolation material 150 may comprise at least one dielectric material, such as one or more of a dielectric oxide material (e.g., silicon dioxide; phosphosilicate glass; borosilicate glass; borophosphosilicate glass; fluorosilicate glass; aluminum oxide; high-k oxides, such as $HfO_x$; a combination thereof), a dielectric nitride material (e.g., SiN, a dielectric an oxynitride material (e.g., SiON), a dielectric carbonitride material (e.g., SiCN), and a dielectric carboxynitride material (e.g., SiOCN), and amphorous carbon. A material composition of the isolation material 150 may be substantially the same as or may be different than that of one or more of the nitride caps 106, the low-K dielectric material 108, the oxide dielectric material 110, the nitride dielectric material 112, the nitride dielectric structures 130, and the another nitride dielectric material 144.

The isolation material 150 may be formed using conventional processes (e.g., conventional deposition processes) and conventional processing equipment, which are not described in detail herein. For example, the isolation material 150 may be formed on or over portions of the exposed surfaces of the semiconductor device structure 100 using one or more conventional non-conformal deposition processes (e.g., a non-conformal PVD process).

Following the formation of the isolation material 150, the semiconductor device structure 100 may be subjected to additional processing, as desired. For example, referring to FIG. 11, storage node structures 152 (e.g., capacitor structures) may be formed vertically over and in electrical communication with the RDM structures 134. Such additional processing may employ conventional processes and conventional processing equipment, and therefore is not described in detail herein.

Thus, in accordance with embodiments of the disclosure, a method of forming a semiconductor device comprises forming a semiconductive device structure comprising semiconductive pillars, digit lines between the semiconductive pillars, nitride caps overlying the digit lines and having upper surfaces offset from upper surfaces of the semiconductive pillars, and dielectric stacks extending between the semiconductive pillars and the digit lines and each comprising a low-K dielectric material, an oxide material, and a nitride material. Nitride structures are formed over surfaces of the nitride caps and the oxide material. Redistribution material structures are formed over exposed surfaces of the semiconductive pillars, the nitride structures, and the nitride caps. Portions of the nitride structures not covered by the redistribution material structures are selectively removed to partially uncover the oxide material. Another nitride material is formed over exposed surfaces of the redistribution material structures, the nitride structures, and the oxide material. Portions of the another nitride material overlying the oxide material are selectively removed. Portions of the oxide material are selectively removed to form air gaps between the digit lines and remainders of the semiconductive pillars. An isolation material is formed over exposed surfaces of the redistribution material structures and the another nitride material while substantially maintaining the air gaps.

Furthermore, a semiconductor device according to embodiments of the disclosure comprises semiconductive pillars; digit lines laterally between the semiconductive pillars; nitride caps vertically overlying the digit lines; nitride structures overlying surfaces of the nitride caps; redistribution material structures comprising upper portions overlying upper surfaces of the nitride caps and the nitride structures, and lower portions overlying upper surfaces of the semiconductive pillars; a low-K dielectric material laterally between the digit lines and the semiconductive pillars; air gaps laterally between the low-K dielectric material and the semiconductive pillars, and having upper boundaries below the upper surfaces of the nitride caps; and a nitride dielectric material laterally between the air gaps and the semiconductive pillars.

Figure 12:
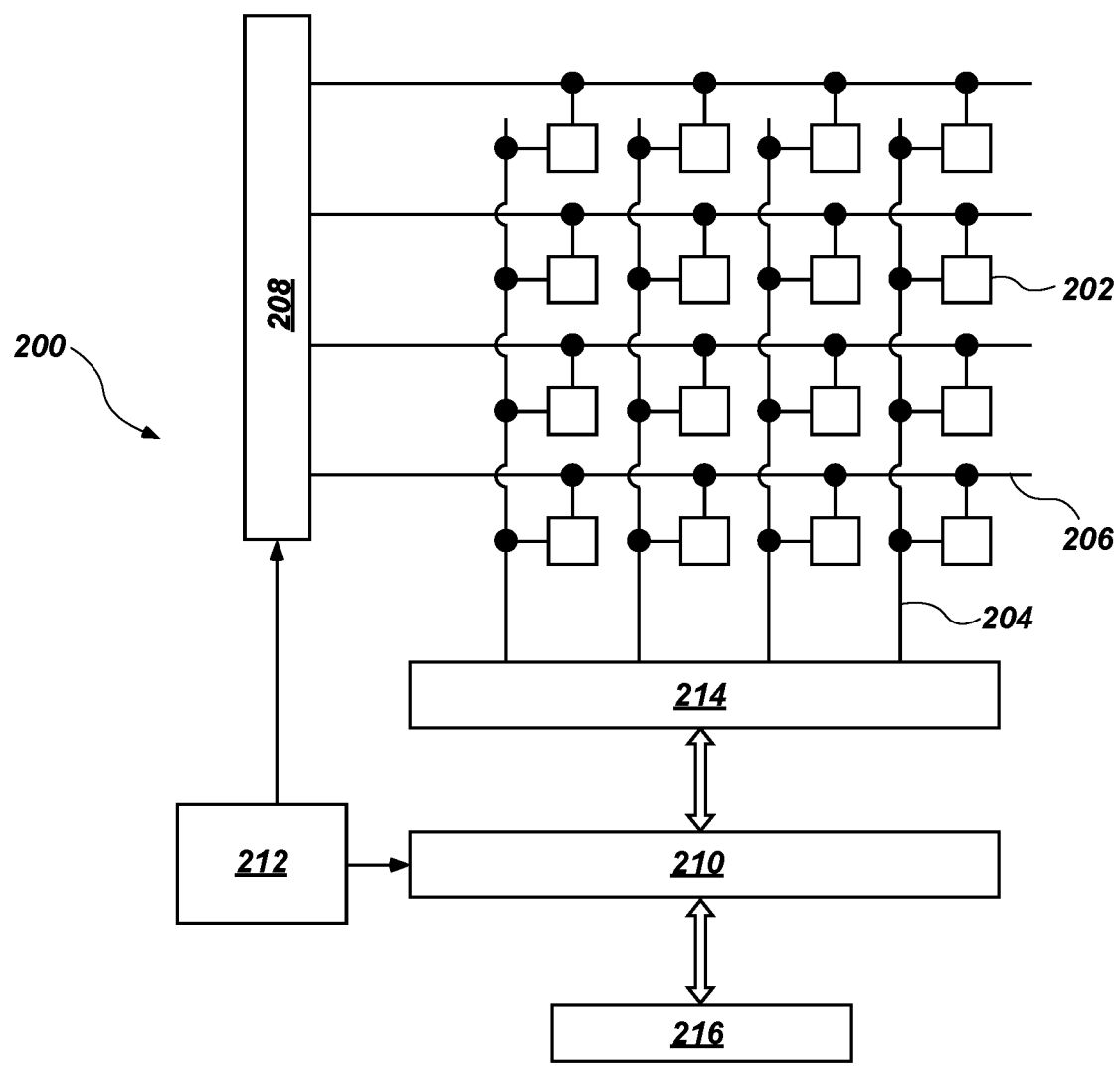
FIG. 12 is a functional block diagram of a memory device, in accordance with an embodiment of the disclosure.

FIG. 12 illustrates a functional block diagram of a memory device 200, in accordance with an embodiment of the disclosure. The memory device 200 may include, for example, an embodiment of the semiconductor device structure 100 previously described herein. As shown in FIG. 12, the memory device 200 may include memory cells 202, digit lines 204 (e.g., bit lines), word lines 206 (e.g., access lines), a row decoder 208, a column decoder 210, a memory controller 212, a sense device 214, and an input/output device 216.

The memory cells 202 of the memory device 200 are programmable to at least two different logic states (e.g., logic 0 and logic 1). Each memory cell 202 may individually include a capacitor and transistor (e.g., a pass transistor). The capacitor stores a charge representative of the programmable logic state (e.g., a charged capacitor may represent a first logic state, such as a logic 1; and an uncharged capacitor may represent a second logic state, such as a logic 0) of the memory cell 202. The transistor grants access to the capacitor upon application (e.g., by way of one of the word lines 206) of a minimum threshold voltage to a semiconductive channel thereof for operations (e.g., reading, writing, rewriting) on the capacitor.

The digit lines 204 are connected to the capacitors of the memory cells 202 by way of the transistors of the memory cells 202. The word lines 206 extend perpendicular to the digit lines 204, and are connected to gates of the transistors of the memory cells 202. Operations may be performed on the memory cells 202 by activating appropriate digit lines 204 and word lines 206. Activating a digit line 204 or a word line 206 may include applying a voltage potential to the digit line 204 or the word line 206. Each column of memory cells 202 may individually be connected to one of the digit lines 204, and each row of the memory cells 202 may individually be connected to one of the word lines 206. Individual memory cells 202 may be addressed and accessed through the intersections (e.g., cross points) of the digit lines 204 and the word lines 206.

The memory controller 212 may control the operations of memory cells 202 through various components, including the row decoder 208, the column decoder 210, and the sense device 214. The memory controller 212 may generate row address signals that are directed to the row decoder 208 to activate (e.g., apply a voltage potential to) predetermined word lines 206, and may generate column address signals that are directed to the column decoder 210 to activate (e.g., apply a voltage potential to) predetermined digit lines 204. The memory controller 212 may also generate and control various voltage potentials employed during the operation of the memory device 200. In general, the amplitude, shape, and/or duration of an applied voltage may be adjusted (e.g., varied), and may be different for various operations of the memory device 200.

During use and operation of the memory device 200, after being accessed, a memory cell 202 may be read (e.g., sensed) by the sense device 214. The sense device 214 may compare a signal (e.g., a voltage) of an appropriate digit line 204 to a reference signal in order to determine the logic state of the memory cell 202. If, for example, the digit line 204 has a higher voltage than the reference voltage, the sense device 214 may determine that the stored logic state of the memory cell 202 is a logic 1, and vice versa. The sense device 214 may include transistors and amplifiers to detect and amplify a difference in the signals (commonly referred to in the art as "latching"). The detected logic state of a memory cell 202 may be output through the column decoder 210 to the input/output device 216. In addition, a memory cell 202 may be set (e.g., written) by similarly activating an appropriate word line 206 and an appropriate digit line 204 of the memory device 200. By controlling the digit line 204 while the word line 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line 204, which is then pulled up to full level (e.g., full charge or discharge) by the sense device 214. When the word line 206 associated with the memory cell 202 is deactivated, all of memory cells 202 in the row associated with the word line 206 are restored to full charge or discharge.

Thus, a memory device according to embodiments of the disclosure comprises a memory controller, a row decoder, a column decoder, word lines, digit lines, memory cells, cell contact structures, nitride structures, redistribution structures, a low-K dielectric material, air gaps, and a nitride dielectric material. The row decoder is operably coupled to the memory controller. The column decoder is operably coupled to the memory controller. The word lines are operably coupled to the row decoder. The digit lines extend to and are operably coupled to the column decoder. The memory cells are positioned at intersections of the word lines and the digit lines, and comprise capacitors and transistors electrically connected to the capacitors. The cell contact structures are laterally between the digit lines. The redistribution structures are operably coupled to and extend between the cell contact structures and capacitors of the memory cells. The redistribution structures comprise upper portions overlying upper surfaces of the nitride structures, and lower portions overlying upper surfaces of the cell contact structures. The low-K dielectric material is laterally between the digit lines and the cell contact structures. The air gaps are laterally between the low-K dielectric material and the cell contact structures, and have upper boundaries below the upper surfaces of the nitride structures. The nitride dielectric material is laterally between the air gaps and the cell contact structures.

Figure 13:
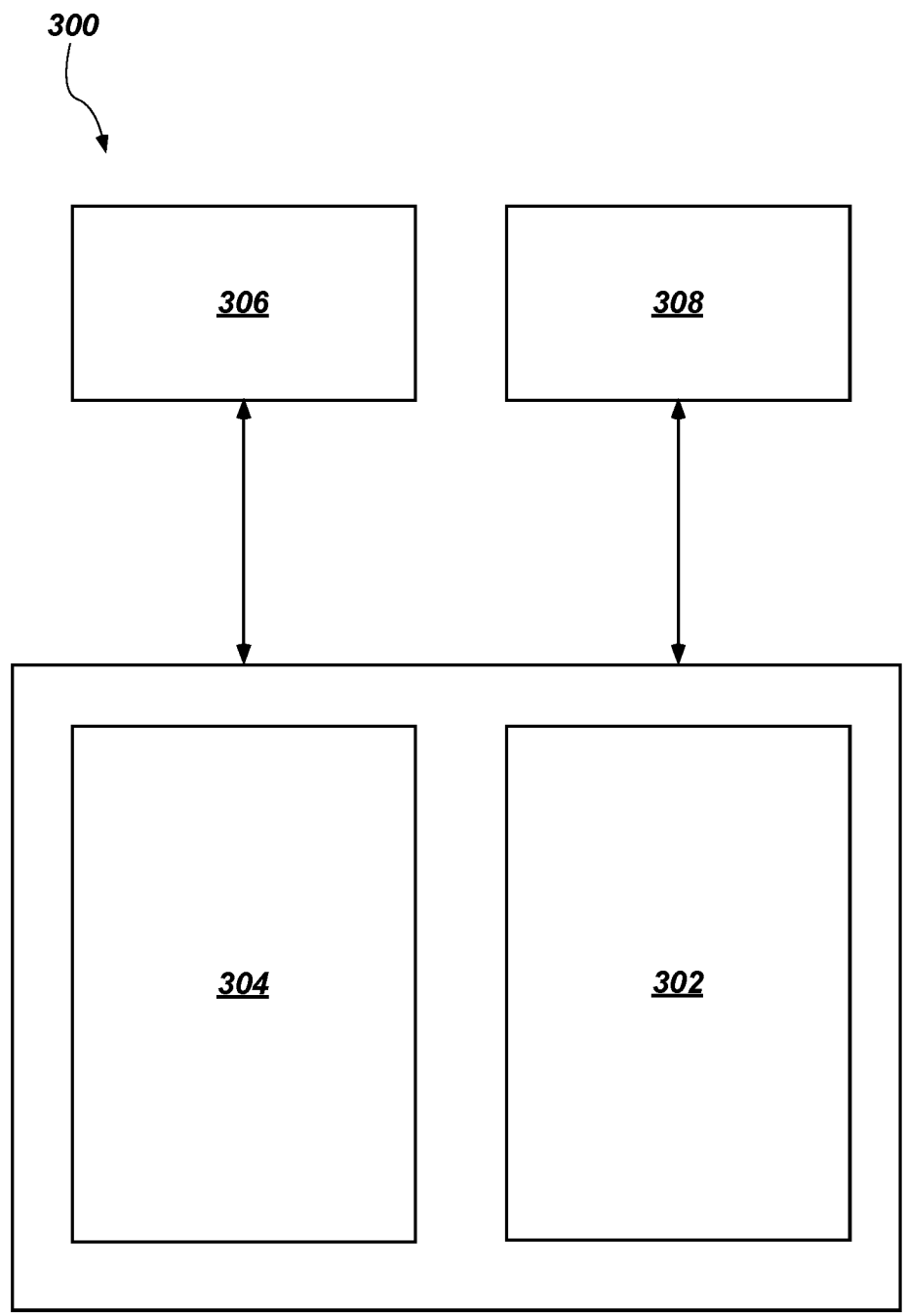
FIG. 13 is a schematic block diagram of an electronic system, in accordance with an embodiment of the disclosure.

Semiconductor device structures (e.g., the semiconductor device structure 100) and semiconductor devices (e.g., the memory device 200) in accordance with embodiments of the disclosure may be used in embodiments of electronic systems of the disclosure. For example, FIG. 13 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a semiconductor device structure (e.g., semiconductor device structure 100) and a semiconductor device (e.g., the memory device 200) previously described herein. The electronic system 300 may further include at least one electronic signal processor device 304 (often referred to as a "microprocessor"). The electronic signal processor device 304 may, optionally, include an embodiment of a semiconductor device structure (e.g., semiconductor device structure 100) and a semiconductor device (e.g., the memory device 200) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises a semiconductive device structure comprising laterally alternating semiconductive pillars and digit lines, a low-K dielectric material intervening between the digit lines and the semiconductive pillars, air gaps intervening between the low-K dielectric material and the semiconductive pillars, a nitride dielectric material intervening between the air gaps and the semiconductive pillars, nitride dielectric structures vertically overlying the digit lines and having uppermost boundaries vertically above uppermost boundaries of the air gaps, and conductive redistribution structures electrically connecting the semiconductive pillars to capacitors. Upper portions of the conductive redistribution structures vertically overlie the uppermost boundaries of the nitride dielectric structures, and lower portions of the conductive redistribution structures vertically overlie uppermost boundaries of the semiconductive pillars.

The methods of the disclosure may facilitate the formation of semiconductor devices (e.g., memory devices, such as DRAM devices) and systems (e.g., electronic systems) having one or more of increased performance, increased efficiency, increased reliability, and increased durability as compared to conventional semiconductor devices (e.g., conventional memory devices, such as conventional DRAM devices) and conventional systems (e.g., conventional electronic systems). For example, the methods of the disclosure may facilitate the formation of air gaps laterally adjacent to digit lines to effectuate a reduction in undesirable capacitive coupling, while also protecting electrically conductive features (e.g., RDM structures) from being undesirably etched during the formation of the air gaps so as to preserve the integrity of both the electrically conductive features and the air gaps. Protecting the electrically conductive features from being etched (e.g., by way of the nitride structures and materials of the disclosure) during the formation of the air gaps may, for example, substantially prevent the conductive material thereof from being deposited within the air gaps, which may otherwise increase the risk of electrical shorts. The nitride structures (e.g., the nitride structures 130) of the disclosure may also provide enhanced support for the RDM structures (e.g., the RDM structures 134) of the disclosure, mitigating or preventing undesirable structural distortions (e.g., bending) in the semiconductor devices of the disclosure.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A semiconductor device, comprising:
semiconductive pillars;
digit lines laterally between the semiconductive pillars;
nitride caps vertically overlying the digit lines;
nitride structures overlying surfaces of the nitride caps;
redistribution material structures comprising upper portions overlying upper surfaces of the nitride caps and the nitride structures, and lower portions overlying upper surfaces of the semiconductive pillars;
a low-K dielectric material laterally between the digit lines and the semiconductive pillars;
air gaps laterally between the low-K dielectric material and the semiconductive pillars, and having upper boundaries below the upper surfaces of the nitride caps; and
a nitride dielectric material laterally between the air gaps and the semiconductive pillars.

2. The semiconductor device of claim 1, wherein the low-K dielectric material has a lower dielectric constant than $Si_3N_4$ and a thickness within a range of from about 1 nm to about 3 nm.

3. The semiconductor device of claim 1, wherein the air gaps vertically extend from locations vertically below lower surfaces of the digit lines to other locations vertically above upper surfaces of the digit lines.

4. The semiconductor device of claim 1, further comprising an oxide dielectric material vertically below and in contact with the air gaps.

5. The semiconductor device of claim 1, wherein the redistribution material structures comprise an electrically conductive material in electrical communication with the semiconductive pillars.

6. The semiconductor device of claim 5, further comprising capacitors vertically overlying and in electrical communication with the upper portions of the redistribution material structures.

7. The semiconductor device of claim 1, wherein the nitride caps and the nitride structures comprise different dielectric nitride materials than one another.

8. A memory device, comprising:
a memory controller;
a row decoder operably coupled to the memory controller;
a column decoder operably coupled to the memory controller;
word lines operably coupled to the row decoder;
digit lines operably coupled to the column decoder;
memory cells positioned at intersections of the word lines and the digit lines, the memory cells comprising capacitors and transistors electrically connected to the capacitors;
cell contact structures laterally between the digit lines;
nitride structures vertically overlying the digit lines;
redistribution structures operably coupled to and extending between the cell contact structures and capacitors of the memory cells, the redistribution structures comprising:
upper portions overlying upper surfaces of the nitride structures; and
lower portions overlying upper surfaces of the cell contact structures;
a low-K dielectric material laterally between the digit lines and the cell contact structures;
air gaps laterally between the low-K dielectric material and the cell contact structures, and having upper boundaries below the upper surfaces of the nitride structures; and
a nitride dielectric material laterally between the air gaps and the cell contact structures.

9. The memory device of claim 8, wherein the air gaps vertically extend from locations above uppermost boundaries of the digit lines to additional locations below lowermost boundaries of the digit lines.

10. The memory device of claim 8, wherein the low-K dielectric material comprises a carbon-containing dielectric material having a lower dielectric constant than $Si_3N_4$.

11. The memory device of claim 8, wherein the cell contact structures comprise semiconductive pillars that laterally alternate with the digit lines.

12. An electronic system, comprising:
an input device;
an output device;
a processor device operably coupled to the input device and the output device; and
a memory device operably coupled to the processor device and comprising a semiconductive device structure comprising:
laterally alternating semiconductive pillars and digit lines;
a low-K dielectric material intervening between the digit lines and the semiconductive pillars;
air gaps intervening between the low-K dielectric material and the semiconductive pillars;
a nitride dielectric material intervening between the air gaps and the semiconductive pillars;
nitride dielectric structures vertically overlying the digit lines and having uppermost boundaries vertically above uppermost boundaries of the air gaps; and
conductive redistribution structures electrically connecting the semiconductive pillars to capacitors, upper portions of the conductive redistribution structures vertically overlying the uppermost boundaries of the nitride dielectric structures, and lower portions of the conductive redistribution structures vertically overlying uppermost boundaries of the semiconductive pillars.

* * * * *

UNITED STATES PATENT AND TRADEMARK OFFICE
CERTIFICATE OF CORRECTION

PATENT NO. : 10,707,215 B2
APPLICATION NO. : 16/109215
DATED : July 7, 2020
INVENTOR(S) : Arzum F. Simsek-Ege et al.

It is certified that error appears in the above-identified patent and that said Letters Patent is hereby corrected as shown below:

In the Specification
    Column 5,    Line 20,    change "thereof In some" to --thereof. In some--

Signed and Sealed this
Eighteenth Day of August, 2020

Andrei Iancu
*Director of the United States Patent and Trademark Office*